United States Patent [19]

Yoshinaga

[11] Patent Number: 5,811,840
[45] Date of Patent: Sep. 22, 1998

[54] EPITAXIAL WAFER FOR GAP LIGHT-EMITTING ELEMENT AND GAP LIGHT-EMITTING ELEMENT

[75] Inventor: Atsushi Yoshinaga, Chichibu, Japan

[73] Assignee: Showa Denko K.K., Tokyo, Japan

[21] Appl. No.: 895,562

[22] Filed: Jul. 16, 1997

[51] Int. Cl.$^6$ ................. H01L 33/00; H01L 31/0304
[52] U.S. Cl. ............... 257/103; 257/101; 257/102; 257/86
[58] Field of Search ................ 257/86, 103, 102, 257/101

[56] References Cited

U.S. PATENT DOCUMENTS

| | | | |
|---|---|---|---|
| 4,821,274 | 4/1989 | Naud | 257/103 |
| 5,300,792 | 4/1994 | Yanagisawa | 257/101 |
| 5,302,839 | 4/1994 | Kaise | 257/103 |
| 5,349,208 | 9/1994 | Yanagisawa | 257/103 |

OTHER PUBLICATIONS

B. Cleriaud; The Institute of Physics; J. Phys. C: Solid State Phys. 18, pp. 3615–3661; 1985.

*Primary Examiner*—Jerome Jackson
*Attorney, Agent, or Firm*—Armstrong, Westerman, Hattori, McLeland & Naughton

[57] ABSTRACT

An epitaxial wafer for a GaP light-emitting element comprising an n-type GaP buffer layer, n-type GaP layer, nitrogen-doped n-type GaP layer and p-type GaP layer grown sequentially on an n-type GaP single-crystal substrate, in which the sum concentration of Ti, V, Cr, Mn, Fe, Co, Ni, and Cu in the nitrogen-doped n-type GaP layer does not exceed $1 \times 10^{15}$ cm$^{-3}$, and the sum concentration of Ti, V, Cr, Mn, Fe, Co, Ni, and Cu in the buffer layer does not exceed $1 \times 10^{16}$ cm$^{-3}$. n-type and p-type electrodes are formed on the wafer which is then divided to form GaP light-emitting elements.

8 Claims, 5 Drawing Sheets

EPITAXIAL WAFER FOR GAP LIGHT-EMITTING ELEMENT AND GAP LIGHT-EMITTING ELEMENT

BACKGROUND OF THE INVENTION

FIELD OF THE INVENTION

This invention relates to an epitaxial wafer for a GaP light-emitting element and a GaP light-emitting element, more particularly to an epitaxial wafer used for fabricating a GaP light-emitting element that emits yellow green light at a high brightness and to a GaP light-emitting element fabricated from the wafer.

A GaP light-emitting element is normally obtained by using liquid-phase or vapor-phase epitaxis to epitaxially grow a plurality of thin GaP films (epitaxial layers) on an n-type GaP single-crystal substrate while at the same time adding an appropriate type and concentration of impurity to each layer to thereby form a p-n junction within the epitaxial layers. The wafer for a light-emitting element having a diode structure thus fabricated is then used to provide the light-emitting elements in the form of light-emitting diodes.

Since GaP is an indirect transition semiconductor, light-emitting elements that simply use GaP to form a p-n junction have low brightness. Nitrogen being a central component in the light emission, in the fabrication of epitaxial wafers for GaP light-emitting elements that emit yellow green light, to improve the brightness the n-type layer of the p-n junction normally is doped with nitrogen, and to raise the efficiency of carrier injection to the n-type layer that constitutes the light-emitting emitting layer, for the n-type layer, a carrier concentration is used that does not exceed $3 \times 10^{16}$ cm$^{-3}$, and for the p-type junction layer, a carrier concentration is used that does not exceed $2 \times 10^{17}$ cm$^{-3}$. Moreover, in order to suppress degradation of emission efficiency caused by crystal defects in the emission layer, one or more n-type GaP buffer layers are formed on the n-type GaP substrate and epitaxial layers that include the p-n junction are formed on the buffer layers to reduce propagation of the substrate crystal defects to the nitrogen-doped n-type GaP emission layer.

FIG. 1 shows the normal structure of an epitaxial wafer for a GaP yellow green light-emitting element. As shown by FIG. 1, the wafer for a GaP yellow green light-emitting element normally comprises growing a single or multiple n-type GaP buffer layer 12 on an n-type GaP single-crystal substrate 11, and following this by the sequential forming of an n-type GaP layer 13, a nitrogendoped n-type GaP layer 14 and a p-type GaP layer 15. As explained above, the buffer layer 12 is for suppressing propagation of crystal defects from the substrate 11 to the nitrogen-doped n-type GaP layer 14 that constitutes the emission layer, and is not always used.

When liquid-phase epitaxy is used as the epitaxial layer growth method, either of the following methods can be used. In one method, a solution of Ga metal in which GaP is saturated is introduced onto the GaP substrate and the temperature is then reduced to thereby deposit a GaP epitaxial layer on the substrate. In the other method, a solution of Ga metal in which GaP is not saturated is introduced at low temperature onto the substrate and is then heated and maintained at a high temperature, producing a melt-back on the substrate surface and saturating the Ga metal with the GaP, after which the temperature is reduced, resulting in the deposition of a GaP epitaxial layer on the substrate.

In liquid-phase epitaxis of GaP, epitaxial growth is usually initiated at a temperature of 900° to 1000° C. At a high temperature such as that, there is a risk of phosphorus separating from the surface of the GaP substrate and causing an increase in substrate crystal defects. Because of that risk, in the fabrication of wafers for GaP yellow green light-emitting elements by the liquid-phase epitaxial method, the latter method is used more than the former.

Such efforts to optimize the growth method and structure of epitaxial wafers for GaP yellow green light-emitting elements have been used to improve the brightness of the GaP yellow green light-emitting elements fabricated from such wafers. The result is that GaP yellow green light-emitting elements have come into extensive use. However, to further expand the range of applications, there is a need to develop light-emitting elements that are even brighter.

An object of the present invention is to provide an epitaxial wafer for a GaP light-emitting element able to emit light with a major improvement in brightness.

A further object is to provide a GaP light-emitting element in which factors reducing emission efficiency are suppressed and emission brightness is improved.

SUMMARY OF THE INVENTION

The invention achieves the foregoing objects by providing an epitaxial wafer for a GaP light-emitting element comprising an n-type GaP single-crystal substrate, an n-type GaP layer grown on the substrate, a nitrogen-doped n-type GaP layer grown on the n-type GaP layer having a sum concentration of Ti, V, Cr, Mn, Fe, Co, Ni, and Cu not exceeding $1 \times 10^{15}$ cm$^{-3}$, and a p-type GaP layer grown on the n-type GaP layer.

In a further aspect of the invention, the epitaxial wafer for a GaP light-emitting element comprises an n-type GaP single-crystal substrate, a single or multiple n-type GaP buffer layer grown on the substrate, an n-type GaP layer grown on the buffer layer, a nitrogen-doped n-type GaP layer grown on the n-type GaP layer having a sum concentration of Ti, V, Cr, Mn, Fe, Co, Ni, and Cu not exceeding $1 \times 10^{15}$ cm$^{-3}$, and a p-type GaP layer grown on the n-type GaP layer.

In yet a further aspect of the invention, the epitaxial wafer for a GaP light-emitting element comprises a single or multiple n-type GaP buffer layer, a nitrogen-doped n-type GaP layer and a p-type GaP layer formed, in that order, on an n-type GaP single-crystal substrate, wherein a sum concentration of Ti, V, Cr, Mn, Fe, Co, Ni, and Cu contained in the n-type GaP buffer layer does not exceed $1 \times 10^{15}$ cm$^{-3}$.

In yet a further aspect of the invention, the epitaxial wafer for a GaP light-emitting element comprises forming a single or multiple n-type GaP buffer layer, a nitrogen-doped n-type GaP layer and a p-type GaP layer, in that order, on an n-type GaP single-crystal substrate, wherein a sum concentration of Ti, V, Cr, Mn, Fe, Co, Ni, and Cu contained in the n-type GaP buffer layer does not exceed $1 \times 10^{16}$ cm$^{-3}$ and a sum concentration of Ti, V, Cr, Mn, Fe, Co, Ni, and Cu contained in the nitrogen-doped n-type GaP layer does not exceed $1 \times 10^{15}$ cm$^{-3}$.

A GaP light-emitting element according to the invention is comprised by an electrode of a first conductivity type provided on a rear surface of the n-type GaP single-crystal substrate formed by the epitaxial wafer and an electrode of a second conductivity type provided on a front surface of the p-type GaP layer.

For the reasons described hereinbelow, markedly enhanced brightness is provided by the GaP light-emitting element obtained according to the present invention, using not high-purity materials but high-level purifying of the Ga metal used to form the Ga solution and purifying of graphite material used for the epitaxial growth jig, and a sum concentration of Ti, V, Cr, Mn, Fe, Co, Ni, and Cu in the light-emitting layer that does not exceed $1\times 10^{15}$ cm$^{-3}$ or a sum concentration of Ti, V, Cr, Mn, Fe, Co, Ni, and Cu in the buffer layer that does not exceed $1\times 10^{16}$ cm$^{-3}$.

The above and other objects and features of the present invention will become apparent from the following description made with reference to the drawings.

BRIEF EXPLANATION OF THE DRAWINGS

FIG. 5 (b) illustrates the growth of a buffer layer on the substrate by deposition of GaP from a Ga solution.

FIG. 6 (b) illustrates the substrate deposition of a GaP layer from a Ga solution.

FIG. 6 (c) illustrates growth of a light-emitting layer on a GaP layer.

FIG. 6 (d) illustrates growth of a p-type GaP layer on the light-emitting layer.

DESCRIPTION OF THE PRIOR ART

With respect to GaP light-emitting elements that emit yellow green light, it has been known since before that impurity elements sulfur, oxygen and carbon present in the epitaxial layers reduce emission brightness, and efforts have therefore been made to reduce the amount of those elements. However, not much attention has been paid to sufficiently controlling the impurities Cu, Ni, Fe, Mn and Cr contained in metallic Ga, and Ni, Cu, and Fe present in stainless steel used to form gas pipes, and/or in graphite used to form epitaxial growth jigs and which may therefore be melted in the Ga metal that is the liquid-phase epitaxial growth medium and thereby be mixed into the GaP epitaxial growth layers.

Cu, Ni, Fe, Mn and Cr all belong to a group referred to as first transition elements. Since elements of this group form alloys with one another, there is a possibility that the above elements may also be accompanied by Ti, V or Co, which are also first transition elements.

Hereinbelow, these first transition elements, namely Ti, V, Cr, Mn, Fe, Co, Ni, and Cu are collectively referred to as impurity transition elements. As described in pages 3615 to 3661 of volume 18 (1985) of the Journal of physics C: Solid State physics, extensive research has shown that 3d—3d electron transitions by these impurity transition elements cause a level to form in the forbidden band of GaP. However, the effect that this level formation by the impurity transition elements has on the emission brightness of GaP light-emitting elements has not be clarified. Also, research has only related to analysis of the electron structure of impurity transition elements in the GaP; there has been no research relating to the effect the elements have on crystal structure (crystallinity).

Figure 1:
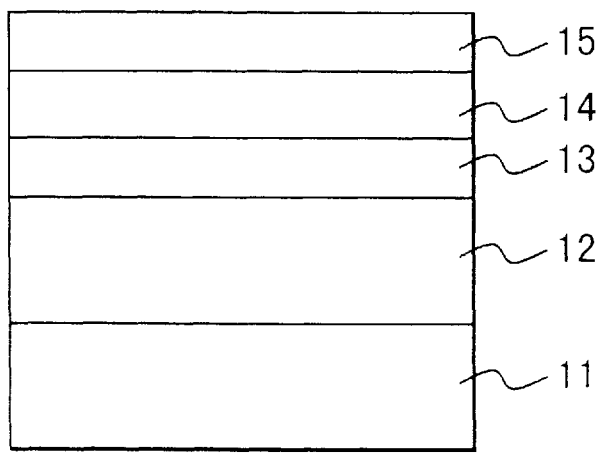
FIG. 1 is a diagram illustrating the structure of an epitaxial wafer for forming a GaP yellow green light-emitting element.
Figure 2:
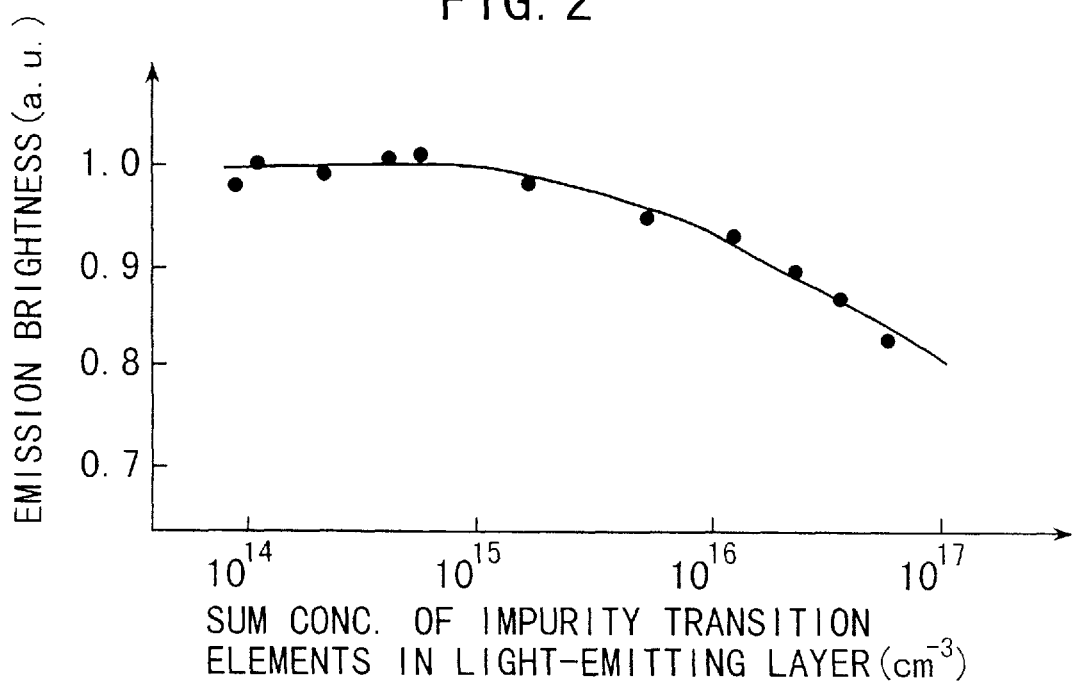
FIG. 2 is a graph showing the relationship between the sum concentration of impurity transition elements in the light-emitting layer of a GaP light-emitting element and emission brightness.

Namely, because the limit of solubility of the impurity transition elements with respect to GaP is in the order of $10^{17}$ cm$^{-3}$ ($10^{18}$ to $10^{19}$ cm$^{-3}$ in the case of Mn), previously it was thought that those elements do not affect the brightness so long as they were not deliberately used as dopants. This resulted in the lack of interest in controlling them. However, the present inventors used SIMS analysis to quantify the concentrations of the impurity transition elements with the aim of investigating factors producing a lowering of emission efficiency of epitaxial wafers used to fabricate GaP yellow green light-emitting elements. The results are shown in FIG. 2. Namely, it was found that there is a correlation between the emission brightness of light-emitting elements and the concentrations of the impurity transition elements in the nitrogen-doped n-type GaP layer constituting the emission layer, and that the brightness decreases when the sum concentration of the elements in the emission layer is $10^{15}$ cm$^{-3}$ or higher. The "a.u." shown in FIGS. 2 to 4 and 8 is an abbrebiation for arbitrary unit.

Figure 3:
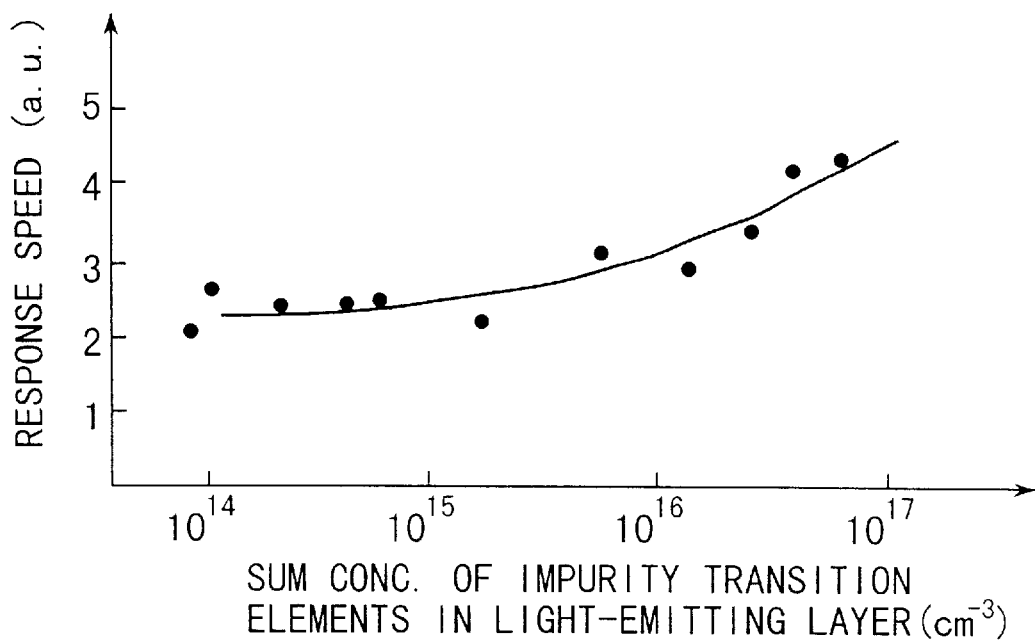
FIG. 3 is a graph showing the relationship between the sum concentration of impurity transition elements in the light-emitting layer of a GaP light-emitting element and response speed.
Figure 4:
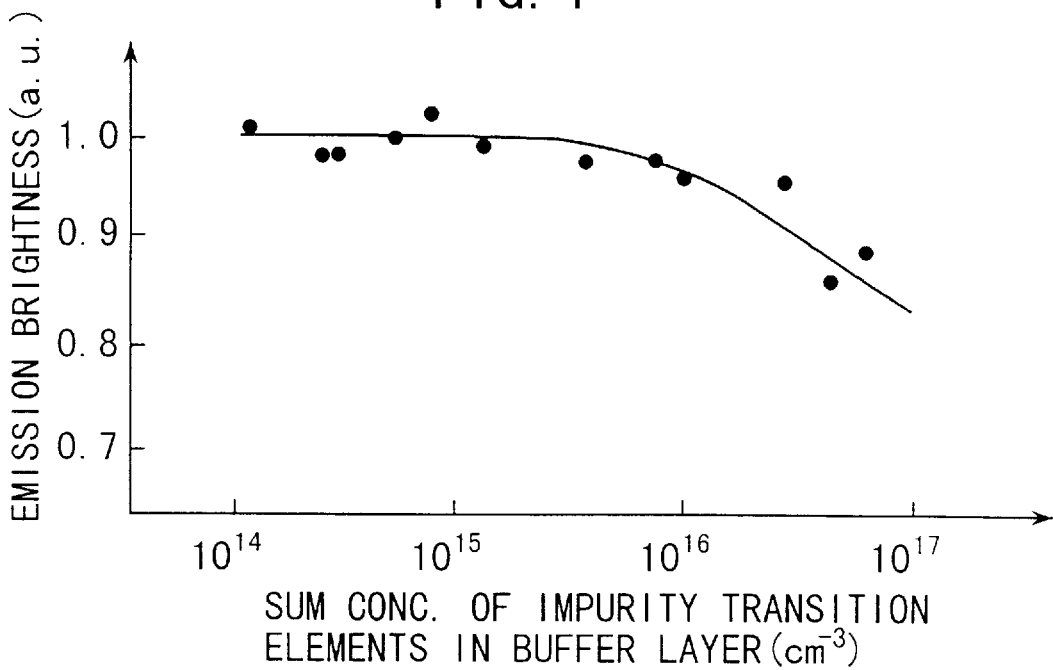
FIG. 4 is a graph showing the relationship between the sum concentration of impurity transition elements in the buffer layer of a GaP light-emitting element and emission brightness.

As described in the above reference material, the location of the energy levels the impurity transition elements form in the GaP forbidden band has not been confirmed. However, based on the fact that, as shown by FIG. 3, response speed increases when the sum concentration of the impurity transition elements in the emission layer is at or above $10^{15}$ cm$^{-3}$, it is considered that the drop in brightness may be caused by mainly non-emission recombination by such elements in the emission layer. The present inventors also investigated the relationship between brightness and the concentrations of impurity transition elements in buffer layers in the case of epitaxial wafers for GaP yellow green light-emitting elements having an n-type GaP buffer layer. The results are shown in FIG. 4. Again, it was found that there is a correlation between the emission brightness of a light-emitting element and the concentrations of the impurity transition elements in buffer layers, showing that those elements in the buffer layer degrades the brightness. The reduction in emission brightness becomes marked when the sum concentration of the impurity transition elements reaches or exceeds $10^{16}$ cm$^{-3}$, ten times higher than the emission layer.

Unlike an emission layer, a buffer layer does not directly contribute to light emission. Therefore, in the case of the impurity transition elements in the buffer layer it is considered that the decrease in the emission brightness is caused not by non-emission recombinations by such elements, but by an increase in the absorption of the portion of emitted light going toward the surface after being reflected from the substrate (the rear surface of the element).

Based on the above findings, it was established that the emission brightness of a GaP yellow green light-emitting element is improved by limiting the sum concentration of the impurity transition elements to $1\times 10^{15}$ cm$^{-3}$ in the case of the emission layer, and to $1 \times 10^{16}$ $cm^{-3}$ in the case of a buffer layer. Limiting the sum concentration of Ti, V, Cr. Mn, Fe, Co, Ni, and Cu in the nitrogen-doped n-type GaP layer constituting the emission layer reduces the concentration of non-emission recombinations in the emission layer, resulting in an improvement in the emission brightness of GaP yellow green light-emitting elements. Similarly limiting the sum concentration of Ti, V, Cr, Mn, Fe, Co, Ni, and Cu in n-type GaP buffer layers reduces light absorption by buffer layers, thus also resulting in an improvement in the emission brightness of GaP yellow green light-emitting elements.

Embodiments of the epitaxial wafer for fabricating GaP yellow green light-emitting elements according to the invention will now be described in detail.

Figure 5A:
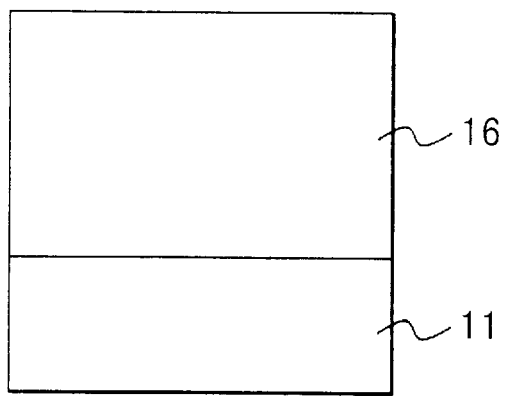
FIG. 5 (a) illustrates the arrangement on the substrate of a Ga solution containing silicon and GaP.
Figure 5B:
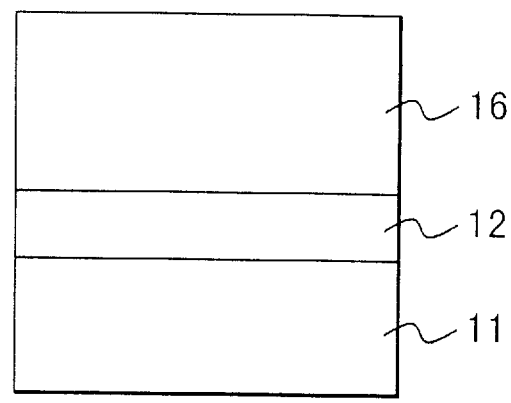

The method of growing an n-type GaP buffer layer 12 on an n-type GaP single-crystal substrate 11 will now be described with reference to FIG. 5. With reference to FIG. 5 (a), to form buffer layer, a Ga solution 16 containing an appropriate amount of an n-type impurity in the form of silicon and a saturation amount of GaP is introduced onto an n-type GaP substrate 11 in a hydrogen atmosphere in a liquid-phase epitaxial growth furnace at a temperature of 1030° C.

The temperature is then raised to 1040° C. to form a melt-back on the surface of the n-type GaP substrate 11, after which the temperature is lowered at the rate of 1° C./minute to form a deposition of GaP from the Ga solution 16 on the n-type GaP substrate 11, thereby growing the n-type GaP buffer layer 12 shown in FIG. 5 (b). Following this, the growth process is terminated when the temperature has been lowered to 700° C. and the Ga solution 16 used to form the n-type GaP buffer layer 12 is separated from the n-type GaP substrate 11. The above process is repeated if the buffer layer 12 is to be formed as a multiple type layer. The above process is used to form an n-type GaP buffer layer approximately 100 $\mu$m thick with a carrier concentration of approximately $2 \times 10^{17}$ cm$^3$.

Impurity transition elements can enter the n-type GaP buffer layer during the above buffer layer formation process using the Ga solution, via gas pipes, materials and the like that contain those elements, such as the graphite, quartz or the like used to form jigs and the Ga metal and the like used for the Ga solution. To prevent impurity transition elements thus becoming mixed in, it is necessary to use raw materials having a high degree of purity.

Particularly with respect to the Ga metal for the Ga solution used in the GaP buffer layer formation process, the inventors found that the inclusion of impurity transition elements could be effectively prevented by first purifying the Ga metal beforehand by washing it in chlorine at around 60° or 70° C. vacuum drying it, and baking it for three to five hours at around 1000° C. It was also found that inclusion of impurity transition elements in graphite used for jigs could be effectively prevented by first using a heat-treatment furnace to bake the graphite for two to three hours at around 1200° C. in a hydrogen chloride atmosphere. Implementing the above processing made it possible to keep the sum concentration of the Ti, V, Cr, Mn, Fe, Co, Ni, and Cu in the n-type GaP buffer layer down to between around $1 \times 10^{14}$ cm$^{-3}$ to $9 \times 10^{14}$ cm$^{-3}$.

Figure 6:
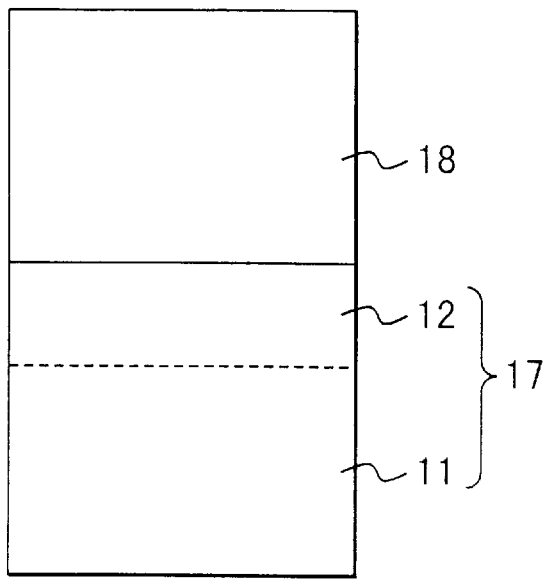
FIG. 6 (a) illustrates the arrangement of a Ga solution on a substrate on which a buffer layer has been formed.
Figure 6:
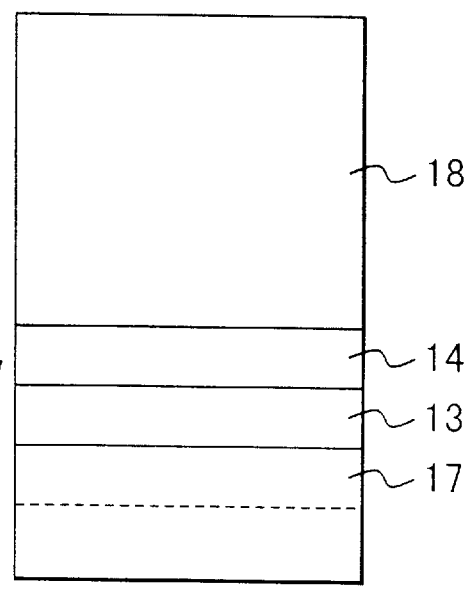
Figure 6:
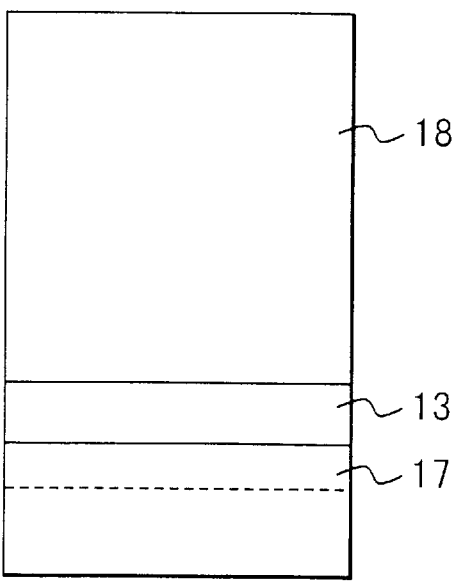
Figure 6:
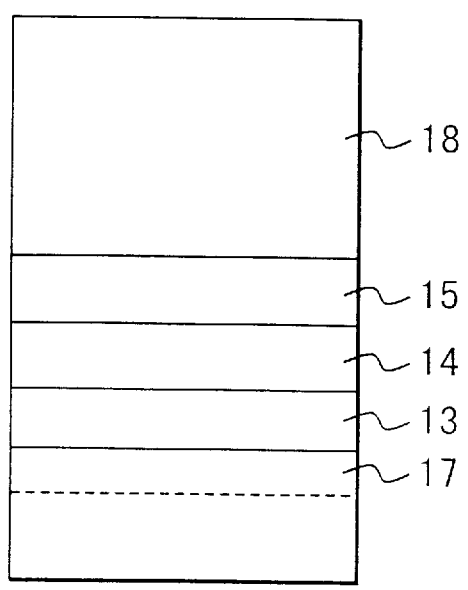

The method of forming an epitaxial layer that includes a p-n junction on the n-type GaP substrate on which a n-type GaP buffer layer has been formed by the above method will now be described, with reference to FIG. 6. With reference to FIG. 6 (a), an unsaturated Ga solution 18 of GaP was introduced onto a substrate 17 in a hydrogen atmosphere at 600° C. The system was then heated to 980° C. and maintained at that temperature for a set time. This produced a melt-back on the surface of the n-type GaP substrate 17 on which the buffer layer was formed, producing a state in which the Ga solution 18 contained a saturation amount of GaP at 980° C. At the same time, silicon in the buffer layer and silicon generated by hydrogen reduction of quartz members such as the reaction tube dissolves in the Ga solution 18. This silicon forms the n-type impurity of the subsequent GaP epitaxial layers.

The temperature is then lowered to 960° C. and n-type GaP layer 13 formed on the substrate 17, as shown in FIG. 6 (b). Next, with the temperature maintained at 960° C. ammonia (NH$_3$) is added to the gas atmosphere. The decomposition of the ammonia adds nitrogen to the Ga solution 18. The emission layer in the form of nitrogen-doped n-type GaP layer 14 is then formed, as shown in FIG. 6 (c). The nitrogen incorporated into the emission layer 14 replaces phosphorus in the GaP and becomes central to the emission. Since nitrogen added to the Ga solution 18 bonds with silicon in the Ga solution 18 and therefore has the effect of lowering the silicon concentration in the solution, the carrier concentration in the emission layer 14 can be lowered.

Zinc is added to the Ga solution 18 by heating the sub-furnace provided adjacent to the epitaxial furnace on the gas flow upstream side to 750° C. and introducing metallic zinc into the sub-furnace to generate zinc vapor which is then introduced into the epitaxial furnace. A p-type GaP layer 15 is then formed on the emission layer 14, as shown in FIG. 6 (d), by lowering the system temperature. The p-type GaP layer 15 is then separated from the Ga solution 18.

An epitaxial layer that includes a p-n junction can thus be formed on an n-type GaP substrate on which an n-type GaP buffer layer has been formed, by means of the above process. The result is that it is possible to produce an epitaxial wafer for a GaP light-emitting element having a diode structure. The same method can also be used to form an epitaxial layer including a p-n junction directly on an n-type GaP substrate on which a buffer layer has not been formed, simply by using an n-type GaP substrate on which a buffer layer has not been formed, instead of the n-type GaP substrate on which an n-type GaP buffer layer has been formed used in the above process.

As in the case of the process used to form the n-type GaP buffer layer, impurity transition elements can enter the emission layer during the above process of forming an epitaxial layer that includes a p-n junction via gas pipes, materials and the like that contain those elements, such as the graphite, quartz or the like used to form jigs and the Ga metal and the like used for the Ga solution. An effective way of preventing impurity transition elements thus finding their way in is to apply high-level purification of the Ga metal and purify graphite jig members.

When using an n-type GaP substrate on which an n-type GaP buffer layer is formed, intrusion of impurity transition elements from the buffer layer is a possibility. In this case too, the above-described method can be used to reduce the concentration of impurity transition elements in the n-type GaP buffer layer to control the sum concentration of Ti, V, Cr, Mn, Fe, Co, Ni, and Cu within the formed emission layer to within the order of from $1 \times 10^{14}$ cm$^{-3}$ to $9 \times 10^{14}$ cm$^{-3}$.

Figure 7:
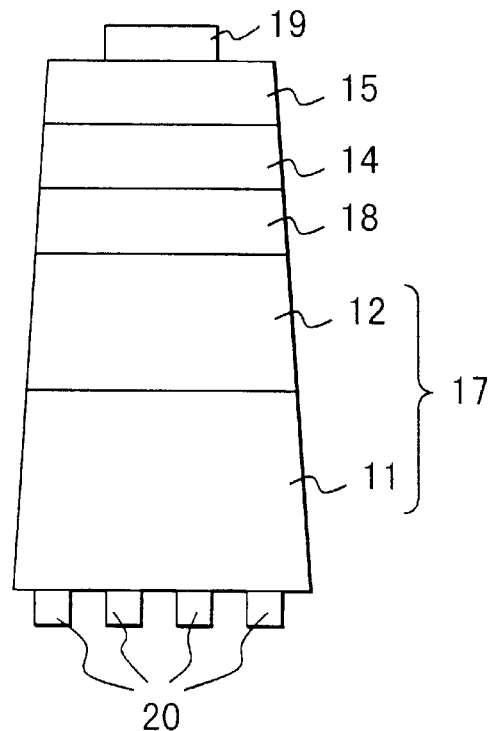
FIG. 7 shows the arrangement of a GaP light-emitting element configured by providing the wafer of FIG. 6 (d) with electrodes.

As shown in FIG. 7, with respect to the epitaxial wafer for a GaP light-emitting element thus fabricated, AuGe is deposited on the rear surface of the ntype GaP single-crystal substrate 11 and heat-treatment is applied to form an n-type electrode 20 by photoetching. AuBe is deposited on the surface of the p-type GaP layer 15 and heat-treatment is applied to form a p-type electrode 19 by photoetching. Following this, the wafer is separated into discrete elements to thereby obtain GaP yellow green light-emitting elements having a reduced concentration of impurity transition elements in the nitrogen-doped n-type GaP layer 14 and n-type buffer layer 12.

Figure 8:
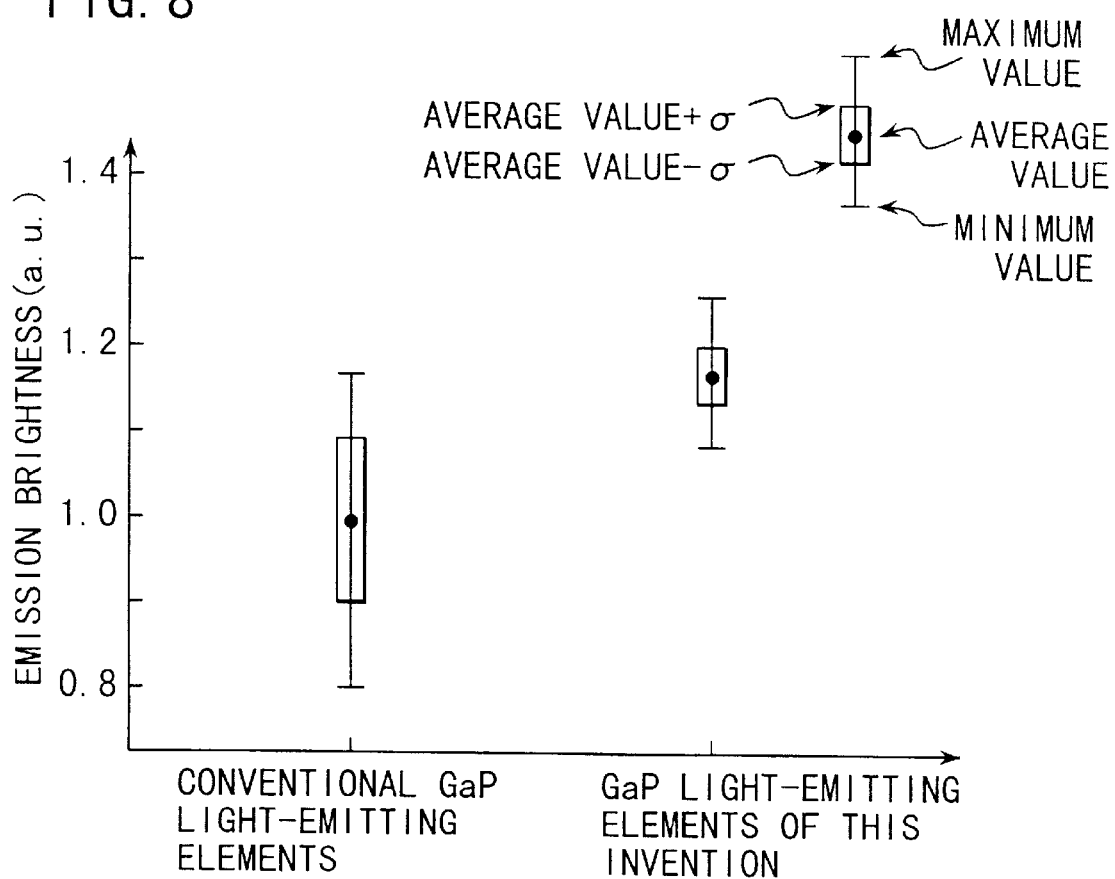
FIG. 8 shows the ranges of brightness of a GaP light-emitting element according to this invention and a conventional GaP light-emitting element.

FIG. 8 shows the average, maximum and minimum brightness values and the range of average brightness to in respect of 120 GaP yellow green light-emitting elements obtained from an epitaxial wafer for GaP light-emitting elements that, in accordance with the above method, had a concentration of impurity transition elements in the n-type GaP buffer layer and in the nitrogen-doped n-type GaP layer not exceeding $1 \times 10^{16}$ cm$^{-3}$ and $1 \times 10^{15}$ cm$^{-3}$, respectively, and 120 GaP yellow green light-emitting elements obtained from a conventional epitaxial wafer for GaP light-emitting elements in which the concentration of the impurity transition elements was not controlled. The graph clearly reveals that reducing the concentration of the impurity transition elements improved the average brightness of the light-emitting elements by around 20%.

The present invention has been described with reference to an epitaxial wafer for GaP light-emitting elements in which the concentration of impurity transition elements in the n-type GaP buffer layer and in the nitrogen-doped n-type GaP layer does not exceed $1 \times 10^{16}$ cm$^{-3}$ and $1 \times 10^{15}$ cm$^{-3}$, respectively, and to GaP light-emitting elements fabricated from the wafer. However, even if the concentration of impurity transition elements in just the n-type GaP buffer layer or in just the nitrogen-doped n-type GaP layer is decreased to below the above value, GaP yellow green light-emitting elements can still be obtained that have a higher brightness than that of conventional GaP light-emitting elements. Also with respect to the epitaxial wafer for GaP light-emitting elements comprised by an n-type GaP layer, a nitrogen-doped n-type GaP layer and a p-type GaP layer formed on an n-type GaP single-crystal substrate, by using a concentration of impurity transition elements in the nitrogen-doped n-type GaP layer that does not exceed $1 \times 10^{15}$ cm$^{-3}$, it is possible to obtain GaP yellow green light-emitting elements having improved brightness compared to conventional GaP light-emitting elements.

What is claimed is:

1. An epitaxial wafer for a GaP light-emitting element comprising
   an n-type GaP single-crystal substrate,
   an n-type GaP layer grown on the substrate,
   a nitrogen-doped n-type GaP layer grown on the n-type GaP layer having a sum concentration of Ti, V, Cr, Mn, Fe, Co, Ni, and Cu not exceeding $1 \times 10^{15}$ cm$^{-3}$, and
   a p-type GaP layer grown on the n-type GaP layer.

2. An epitaxial wafer for a GaP light-emitting element comprising
   an n-type GaP single-crystal substrate,
   a single or multiple n-type GaP buffer layer grown on the substrate,
   an n-type GaP layer grown on the buffer layer,
   a nitrogen-doped n-type GaP layer grown on the n-type GaP layer having a sum concentration of Ti, V, Cr, Mn, Fe, Co, Ni, and Cu not exceeding $1 \times 10^{15}$ cm$^{-3}$, and a p-type GaP layer grown on the n-type GaP layer.

3. An epitaxial wafer for a GaP light-emitting element comprising
   an n-type GaP single-crystal substrate,
   a single or multiple n-type GaP buffer layer grown on the substrate having a sum concentration of Ti, V, Cr, Mn, Fe, Co, Ni, and Cu not exceeding $1 \times 10^{16}$ cm$^{-3}$,
   an n-type GaP layer grown on the buffer layer,
   a nitrogen-doped n-type GaP layer grown on the n-type GaP layer, and
   a p-type GaP layer grown on the n-type GaP layer.

4. An epitaxial wafer according to claim 3, wherein a sum concentration of Ti, V, Cr, Mn, Fe, Co, Ni, and Cu in the nitrogen-doped n-type GaP layer does not exceed $1 \times 10^{15}$ cm$^{-3}$.

5. A GaP light-emitting element comprising
   an n-type GaP single-crystal substrate,
   an n-type GaP layer grown on the substrate,
   a nitrogen-doped n-type GaP layer grown on the n-type GaP layer having a sum concentration of Ti, V, Cr, Mn, Fe, Co, Ni, and Cu not exceeding $1 \times 10^{15}$ cm$^{-3}$,
   a p-type GaP layer grown on the n-type GaP layer,
   an electrode of a first conductivity type provided on a rear surface of the substrate, and
   an electrode of a second conductivity type provided on a front surface of the p-type GaP layer.

6. A GaP light-emitting element comprising
   an n-type GaP single-crystal substrate,
   a single or multiple n-type GaP buffer layer grown on the substrate,
   an n-type GaP layer grown on the buffer layer,
   a nitrogen-doped n-type GaP layer grown on the n-type GaP layer having a sum concentration of Ti, V, Cr, Mn, Fe, Co, Ni, and Cu not exceeding $1 \times 10^{15}$ cm$^{-3}$,
   a p-type GaP layer grown on the n-type GaP layer,
   an electrode of a first conductivity type provided on a rear surface of the substrate, and
   an electrode of a second conductivity type provided on a front surface of the p-type GaP layer.

7. A GaP light-emitting element comprising
   an n-type GaP single-crystal substrate,
   a single or multiple n-type GaP buffer layer grown on the substrate having a sum concentration of Ti, V, Cr, Mn, Fe, Co, Ni, and Cu not exceeding $1 \times 10^{16}$ cm$^{-3}$,
   an n-type GaP layer grown on the buffer layer,
   a nitrogen-doped n-type GaP layer grown on the n-type GaP layer,
   a p-type GaP layer grown on the n-type GaP layer,
   an electrode of a first conductivity type provided on a rear surface of the substrate, and
   an electrode of a second conductivity type provided on a front surface of the p-type GaP layer.

8. A GaP light-emitting element according to claim 7, wherein a sum concentration of Ti, V, Cr, Mn, Fe, Co, Ni, and Cu in the nitrogen-doped n-type GaP layer does not exceed $1 \times 10^{15}$ cm$^{-3}$.

* * * * *